(12) United States Patent
Suzuki et al.

(10) Patent No.: US 7,265,978 B2
(45) Date of Patent: Sep. 4, 2007

(54) CONTROL APPARATUS HAVING FLUID PASSAGE FOR COOLING PURPOSE

(75) Inventors: Fuminori Suzuki, Okazaki (JP); Akira Takagi, Obu (JP)

(73) Assignee: Denso Corporation (JP)

( * ) Notice: Subject to any disclaimer, the term of this patent is extended or adjusted under 35 U.S.C. 154(b) by 288 days.

(21) Appl. No.: 11/091,758

(22) Filed: Mar. 29, 2005

(65) Prior Publication Data

US 2005/0219817 A1 Oct. 6, 2005

(30) Foreign Application Priority Data

Mar. 30, 2004 (JP) .............................. 2004-097654

(51) Int. Cl.
*H05K 7/20* (2006.01)

(52) U.S. Cl. .................... 361/699; 165/80.4; 174/15.1; 257/714

(58) Field of Classification Search ..................... None
See application file for complete search history.

(56) References Cited

U.S. PATENT DOCUMENTS

| | | | | | |
|---|---|---|---|---|---|
| 4,489,570 | A | * | 12/1984 | Little | 62/51.1 |
| 5,070,936 | A | * | 12/1991 | Carroll et al. | 165/80.4 |
| 5,239,443 | A | * | 8/1993 | Fahey et al. | 361/689 |
| 5,316,075 | A | * | 5/1994 | Quon et al. | 165/80.4 |
| 5,436,793 | A | * | 7/1995 | Sanwo et al. | 361/689 |
| 5,870,823 | A | * | 2/1999 | Bezama et al. | 29/848 |
| 6,124,632 | A | * | 9/2000 | Lo et al. | 257/678 |
| 6,463,954 | B1 | | 10/2002 | Panther | |
| 6,468,171 | B1 | | 10/2002 | Panther | |
| 6,565,464 | B1 | | 5/2003 | Panther | |
| 6,796,370 | B1 | * | 9/2004 | Doll | 165/80.4 |
| 6,975,034 | B2 | * | 12/2005 | Hennig et al. | 257/762 |
| 6,992,382 | B2 | * | 1/2006 | Chrysler et al. | 257/717 |
| 7,078,803 | B2 | * | 7/2006 | Tilton et al. | 257/714 |
| 7,114,550 | B2 | * | 10/2006 | Nakahama et al. | 165/80.4 |

FOREIGN PATENT DOCUMENTS

| JP | 11-257483 | 3/1998 |
|---|---|---|
| JP | 11-063219 | 3/1999 |

* cited by examiner

Primary Examiner—Boris Chervinsky
(74) Attorney, Agent, or Firm—Nixon & Vanderhye PC

(57) ABSTRACT

A control apparatus includes a body, a fixation plate and a control circuit arrangement. The body includes first and second fluid passages, which conduct fluid. The fixation plate is installed to the body on one side of the body and includes a third fluid passage, which has a first end connected to the first fluid passage and a second end connected to the second fluid passage. The third fluid passage conducts the fluid from the first fluid passage to the second fluid passage. The control circuit arrangement includes a board and a plurality of on-board devices. The board is installed to a surface of the fixation plate, which is located on one side of the fixation plate that is opposite from the body. The on-board devices are arranged on one side of the board, which is opposite from the fixation plate.

19 Claims, 3 Drawing Sheets

FROM OIL COOLER

TO OIL HYDRAULIC CIRCUIT

FROM OIL COOLER

TO OIL HYDRAULIC CIRCUIT

US 7,265,978 B2

CONTROL APPARATUS HAVING FLUID PASSAGE FOR COOLING PURPOSE

CROSS REFERENCE TO RELATED APPLICATION

This application is based on and incorporates herein by reference Japanese Patent Application No. 2004-97654 filed on Mar. 30, 2004.

BACKGROUND OF THE INVENTION

1. Field of the Invention

The present invention relates to a control apparatus, more particularly to a control apparatus, which includes a fluid passage for cooling purpose.

2. Description of Related Art

In general, a control apparatus includes a board, on which heat generating on-board devices are installed to form a control circuit arrangement. Thus, the heat generated from the on-board devices should be released effectively from the on-board devices and the board. For example, Japanese Unexamined Patent Publication No. 11-257483 discloses one technique for releasing the heat from the on-board devices and the board.

In the case of the invention recited in Japanese Unexamined Patent Publication No. 11-257483, the oil, which has the temperature lower than that of the surrounding of the control circuit arrangement, flows through an oil passage formed in a body. In this way, the heat is released from the on-board devices and the board to the oil, which flows in the oil passage, through a plate.

With respect to the above control apparatus, it has been demanded to downsize the control circuit arrangement. To meet the demand, the packaging density of the control circuit arrangement has been increased. Therefore, the amount of heat released from the on-board devices of the control circuit arrangement, which includes a power device for controlling, for example, a power source, is increased. As a result, effective heat release from the on-board devices and the board is required.

SUMMARY OF THE INVENTION

Thus, it is an objective of the present invention to provide a control apparatus, which is compact and effectively releases heat from a control circuit arrangement thereof.

To achieve the objective of the present invention, there is provided a control apparatus, which includes a body, a plate member and a control circuit arrangement. The body includes first and second fluid passages, which conduct fluid. The plate member is installed to the body on one side of the body and includes a third fluid passage, which has a first end connected to the first fluid passage and a second end connected to the second fluid passage. The third fluid passage conducts the fluid from the first fluid passage to the second fluid passage. The control circuit arrangement includes a board and a plurality of on-board devices. The board is installed to a surface of the plate member, which is located on one side of the plate member that is opposite from the body. The on-board devices are arranged on one side of the board, which is opposite from the plate member.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION

Various embodiments of the present invention will be described with reference to the accompanying drawings.

FIRST EMBODIMENT

Figure 1:
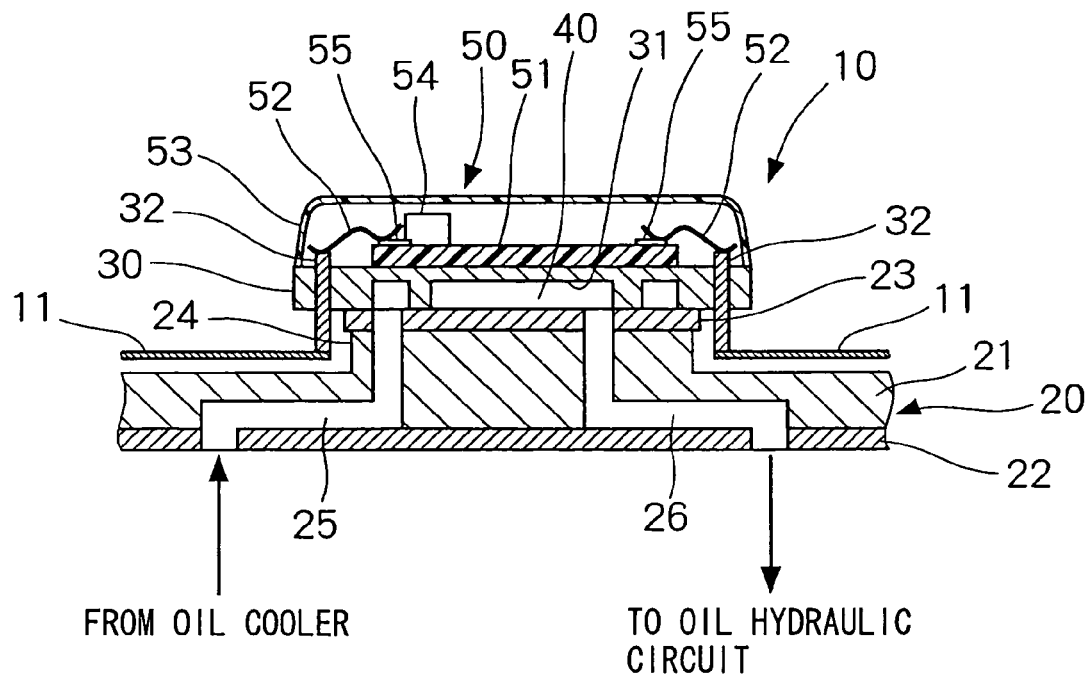
FIG. 1 is a cross sectional view of a control apparatus of a first embodiment taken along line I-I in FIG. 2.
Figure 2:
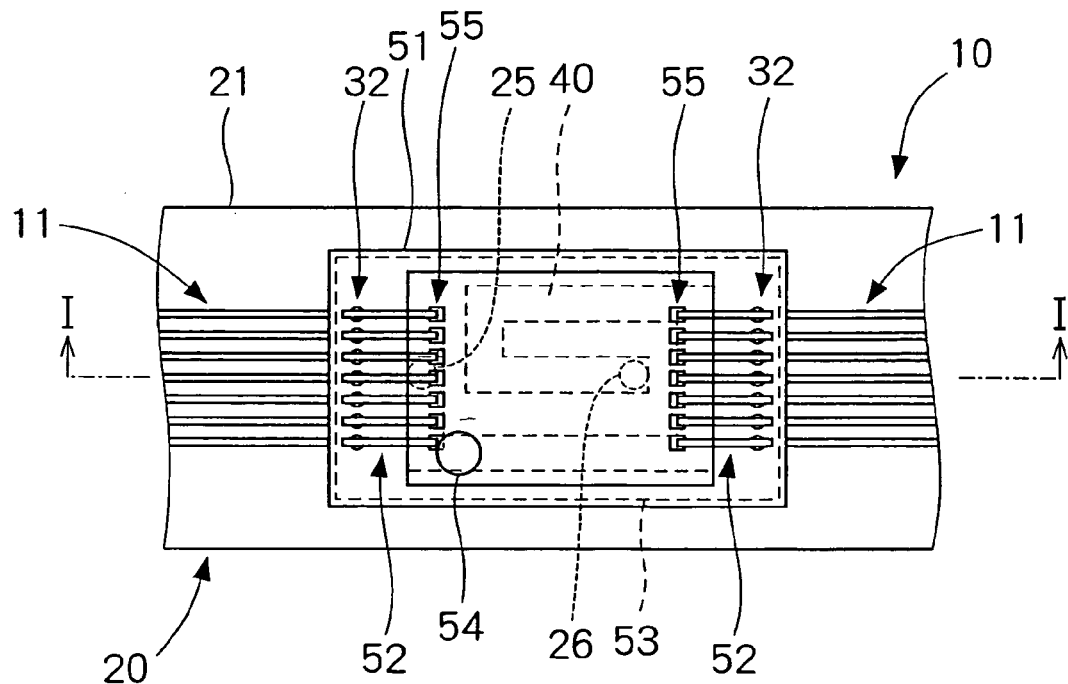
FIG. 2 is a schematic plan view of the control apparatus of the first embodiment of the present invention.
Figure 3:
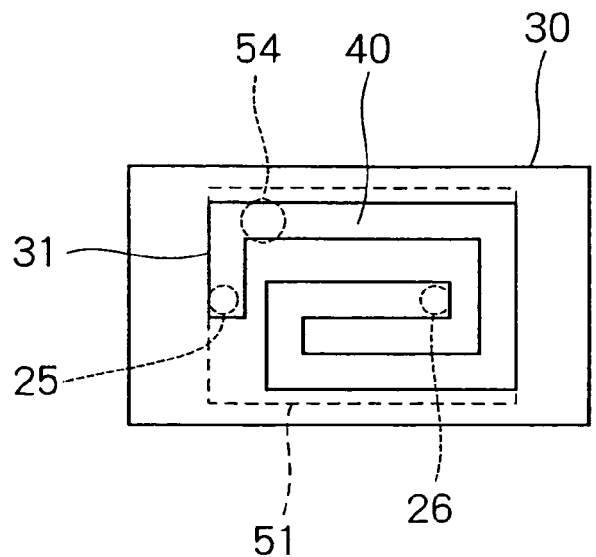
FIG. 3 is a schematic view of a fixation plate of a control apparatus seen from a body side of the control apparatus according to the first embodiment of the present invention.

A control apparatus according to a first embodiment of the present invention is depicted in FIGS. 1-3. The control apparatus 10 of FIG. 1 is installed in an automatic transmission (hereinafter, simply abbreviated to as "AT"). The control apparatus 10 performs a control operation of the entire AT. The control operation of the AT includes, for example, a control operation of a solenoid valve (not shown), which shifts, for example, an engaging element (not shown). In the case of the present embodiment, the control apparatus 10 is installed in a control valve of the AT. The control apparatus 10 includes a body 20, a fixation plate (serving as a plate member) 30 and a control circuit arrangement 50. The body 20 includes a body housing 21 and first and second separation plates 22, 23. The first separation plate 22 is arranged on an opposite side of the body housing 21, which is opposite from the control arrangement 50. The second separation plate 23 is arranged between the body housing 21 and the fixation plate 30. The body housing 21 includes a mount portion 24, which projects from the rest of the body housing 21 on an opposite side of the body housing 21, which is opposite from the first separation plate 22. The second separation plate 23 is installed to the mount portion 24. The fixation plate 30 and the control circuit arrangement 50 are secured to the body 20 by, for example, screws, welding or bonding. The method for securing the fixation plate 30 and the control circuit arrangement 50 to the body 20 is not limited to the above ones and can be thereby any other one.

Each of the body housing 21 and the first and second separation plates 22, 23, which constitute the body 20, has a corresponding part of a first oil passage (serving as a first fluid passage) 25 and a corresponding part of a second oil passage (serving as a second fluid passage) 26. Furthermore, each of the body housing 21 and the first and second separation plates 22, 23 is made of metal, such as aluminum die-casting or steel. In the case of the present embodiment, automatic transmission fluid (ATF) flows through the first and second oil passages 25, 26. The temperature of the ATF, which is supplied from an oil cooler, is lower than the surrounding of the control circuit arrangement 50. Here, it should be noted that the fluid is not necessarily limited to the ATF and can be any fluid, such as engine coolant, as long as it has the fluidity. One end of the first oil passage 25 is connected to the oil cooler (not shown). Furthermore, one end of the second oil passage 26 is connected to, for example, an oil hydraulic circuit of the control valve (not shown).

The fixation plate 30 is made of the metal, such as the aluminum die-casting or the steel. The fixation plate 30 includes a groove (trench) 31 on a body 20 side thereof. The fixation plate 30 forms a cooling passage (serving as a third fluid passage) 40 between the fixation plate 30 and the second separation plate 23 of the body 20. One end (first end) of the cooling passage 40 is connected to the other end of the first oil passage 25, which is opposite from the oil cooler. The other end (second end) of the cooling passage 40, which is opposite from the first oil passage 25, is connected to the other end of the second oil passage 26, which is opposite from the oil hydraulic circuit of the control valve. When the body 20 side of the fixation plate 30, which includes the groove 31, is covered with the second separation plate 23, the cooling passage 40 is formed between the fixation plate 30 and the second separation plate 23.

The fixation plate 30 is rectangular and has a longitudinal length greater than that of the mount portion 24. Thus, opposed longitudinal ends of the fixation plate 30 respectively protrude outwardly from the mount portion 24 in the longitudinal direction. In this way, a space is formed between each longitudinal end of the fixation plate 30 and the body housing 21. Electrically conductive members 32 penetrate through the fixation plate 30 in a thickness direction of the fixation plate 30 (i.e., a direction perpendicular to the plane of the fixation plate 30). The conductive members 32 are provided to the longitudinal ends of the fixation plate 30. Thus, a body housing 21 side end of each conductive member 32 protrudes into the corresponding space, which is defined between the corresponding longitudinal end of the fixation plate 30 and the body housing 21.

The control circuit arrangement 50 is arranged in an opposite surface of the fixation plate 30, which is opposite from the body 20. The control circuit arrangement 50 includes a board 51, on-board devices, bonding wires (serving as wiring members) 52 and a cover 53. The board 51 is fixed to the fixation plate 30 by, for example, heat conductive adhesive, which has a relatively high thermal conductivity. The board 51 includes electrically conductive wiring lines, which constitute an electronic circuit. The on-board devices are arranged on the board 51. The on-board devices include a power device (serving as a heat generating device) 54, which generates a relatively large amount of heat during its operation. The power device (also sometimes referred to as a power element) 54 controls a power source or a solenoid driver, which drives a solenoid valve (not shown).

As shown in FIG. 2, the board 51 includes pads 55, which are connected to the conductive wiring lines (not shown), which are formed on the board 51. Each pad 55 is electrically connected to the corresponding conductive member 32 through the corresponding bonding wire 52. Furthermore, an opposite end of the conductive member 32, which is opposite from the bonding wire 52, is electrically connected to a corresponding wiring member 11. As shown in FIG. 1, each conductive member 32 protrudes into the corresponding space, which is defined between the corresponding longitudinal end of the fixation plate 30 and the body housing 21. Thus, each conductive member 32 and the corresponding wiring member 11 are connected to each other in the corresponding space, which is defined between the longitudinal end of the fixation plate 30 and the body housing 21. In this way, according to the present embodiment, the required volume of the control apparatus 10 is reduced in comparison to the case where each pad 55 and the corresponding wiring member 11 are connected to each other at an outer perimeter of the board 51. Therefore, the size of the control apparatus 10 can be advantageously reduced. The board 51 is covered by the cover 53.

Next, the fixation plate 30 will be described in greater detail.

The groove 31 of the fixation plate 30 is recessed from the body 20 side surface of the fixation plate 30 in a direction away from the body 20. As shown in FIG. 3, the groove 31 is gyrated into a generally spiral shape in the fixation plate 30. Here, it should be noted that the shape of the groove 31 can be changed to any other shape. When the fixation plate 30 is arranged on the second separation plate 23 of the body 20, the cooling passage 40 is defined by the groove 31 of the fixation plate 30 and the second separation plate 23. At this stage, the one end of the cooling passage 40 is connected to the first oil passage 25, and the other end of the cooling passage 40 is connected to the second oil passage 26. In this way, the ATF, which is supplied from the oil cooler (not shown), is supplied to the cooling passage 40 through the first oil passage 25. The ATF, which has passed through the cooling passage 40, is drained to the oil hydraulic circuit of the control valve through the second oil passage 26.

As shown in FIG. 1, the control circuit arrangement 50 is arranged on the opposite side of the fixation plate 30, which is opposite from the body 20. When the control circuit arrangement 50 is arranged on the fixation plate 30, the power device 54, which is arranged on the board 51 of the control circuit arrangement 50, is opposed to a first oil passage side portion (a first fluid passage side portion) of the cooling passage 40 in a direction perpendicular to a plane of the fixation plate 30. Here, the first oil passage side portion of the cooling passage 40 is located near the first oil passage 25 side end of the cooling passage 40 and thereby is closer to the first oil passage portion 25 than the second oil passage portion 26. More specifically, the cooling passage 40, which is defined by the groove 31 of the fixation plate 30 in cooperation with the second separation plate 23, is connected to the first oil passage 25 on the body 20 side of the power device 54 of the control circuit arrangement 50. With this construction, the power device 54, which generates the relatively large amount of heat, is cooled by the ATF, which is supplied from the first oil passage 25 to the cooling passage 40 and has the lower temperature.

In the first embodiment, the cooling passage 40 is formed in the fixation plate 30, on which the control circuit member 50 is arranged. Thus, the fixation plate 30, which is arranged between the body 20 and the board 51 that has the on-board devices including the power device 54, is directly cooled by the ATF, which flows through the cooling passage 40. Therefore, heat release of the control circuit arrangement 50 is improved. Furthermore, the improvement in the heat release of the control circuit arrangement 50 allows easy increase of the packaging density of the on-board devices on the board 51 of the control circuit arrangement 50. Thus, the size of the control circuit arrangement 50 can be advantageously reduced.

Furthermore, in the first embodiment, the groove 31, which forms the cooling passage 40, is provided on the body 20 side of the fixation plate 30. Thus, the groove 31 can be formed into any desired shape by processing the body 20 side of the fixation plate 30. In this way, the shape of the groove 31 can be easily and freely changed based on the positions of the on-board devices of the control circuit arrangement 50. Therefore, the cooling passage 40 can pass through the predetermined point of the fixation plate 30 that is adjacent to the power device 54, which generates the relatively large amount of heat, more specifically, that is located between the power device 54 and the second separation plate 23 to improve the heat release of the control circuit arrangement 50. Furthermore, the cooling passage 40 is formed by the groove 31 of the fixation plate 30, so that the body 20 side of the fixation plate 30 has the complicated recess and protrusion. Thus, the surface area of the body 20 side of the fixation plate 30 is advantageously increased. Therefore, the heat release is further improved.

Furthermore, in the first embodiment, the degree of freedom in the design of the groove 31 is improved, so that the first oil passage 25 side end of the cooling passage 40 can be advantageously positioned adjacent the power device 54. Therefore, the low temperature ATF, which is supplied from the oil cooler through the first oil passage 25, passes near the power device 54 right after entering the cooling passage 40. As a result, the power device 54 is cooled by the ATF, which has the temperature lower than that of the power device 54. In this way, the heat release of the control circuit arrangement 50 is further improved.

SECOND, THIRD AND FOURTH EMBODIMENTS

Figure 4:
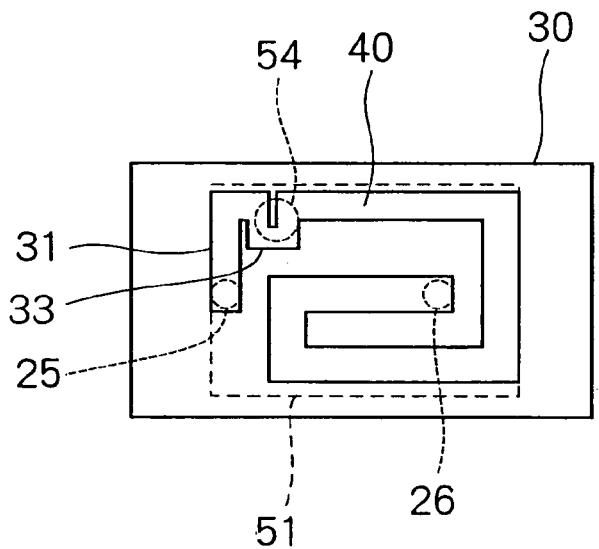
FIG. 4 is a schematic view of a fixation plate of a control apparatus seen from a body side of the control apparatus according to a second embodiment of the present invention.
Figure 5:
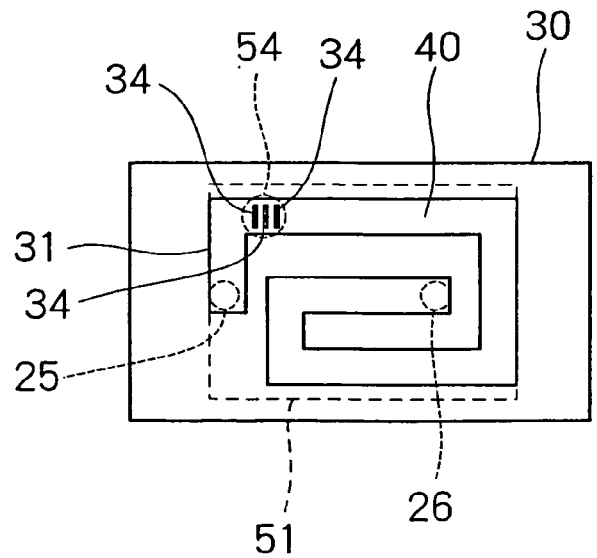
FIG. 5 is a schematic view of a fixation plate of a control apparatus seen from a body side of the control apparatus according to a third embodiment of the present invention.
Figure 6:
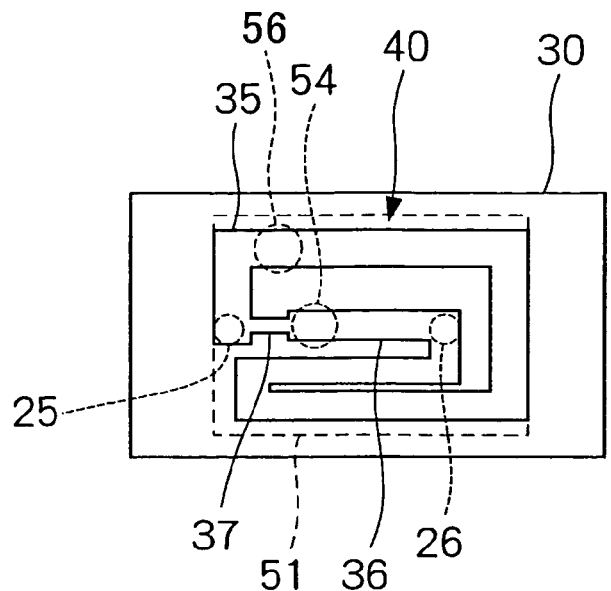
FIG. 6 is a schematic view of a fixation plate of a control apparatus seen from a body side of the control apparatus according to a fourth embodiment of the present invention.

FIGS. 4 to 6 show the fixation plates of the control apparatuses of the second to fourth embodiments, respectively, of the present invention. In the following embodiments, components similar to those of the first embodiment will be indicated by the same numerals and will not be described further.

In each of the second to fourth embodiments, the shape of the groove, which forms the cooling passage, differs from that of the first embodiment.

In the case of the second embodiment, as shown in FIG. 4, the groove 31 includes an irregular portion 33, which has a complex configuration in comparison to the rest of the groove 31 and is located near the power device 54, more specifically, between the power device 54 and the second separation plate 23. With this structure, the entire passage length of the cooling passage 40 is advantageously increased on the body 20 side of the power device 54. Thus, the ATF flows in the cooling passage 40 near the power device 54 for the longer period of time. Therefore, the heat release of the power device 54 is further improved. In this way, the heat release of the control circuit arrangement 50 is further improved.

Furthermore, in the second embodiment, the configuration of the groove 31 becomes more complex in comparison to the first embodiment, so that the surface area of the fixation plate 30, which forms the cooling passage 40 near the power device 54, is increased. Thus, heat release of the control circuit arrangement 50 is improved. Furthermore, in the second embodiment, the groove 31 is formed on the body 20 side of the fixation plate 30. Thus, the irregular portion 33, which has the complex configuration, can be easily formed.

The configuration of the groove 31 is not limited to the simple meander like configuration shown in FIG. 4. For example, the configuration of the groove 31 can be changed to a more complex maze-like configuration.

In the case of the third embodiment, as shown in FIG. 5, the fixation plate 30 has fins 34 on the body 20 side of the power device 54 arranged on the board 51. More specifically, the fins 34 are located between the power device 54 and the second separation plate 23. Each fin 34 protrudes from the wall surface of the fixation plate 30, which forms the groove 31, toward the body 20. Thus, each fin 34 projects into the cooling passage 40. Each fin 34 is located on the body 20 side of the power device 54. In the third embodiment, the fins 34 are formed in the fixation plate 30, so that the surface area of the fixation plate 30 near the power device 54 is increased. Thus, heat release of the control circuit arrangement 50 is improved. Furthermore, in the third embodiment, the groove 31 is formed on the body 20 side of the fixation plate 30. Thus, the complex fins 34 can be easily formed.

In the fourth embodiment, as shown in FIG. 6, the fixation plate 30 has a first groove part 35 and a second groove part 36. Similar to the first to third embodiments, the first groove part 35 is gyrated in the fixation plate 30 from the one end of the first groove part 35, which is connected to the first oil passage 25, to the other end of the first groove part 35, which is connected to the second oil passage 26. In contrast, the second groove part 36 short circuits between the one end of the first groove part 35, which is connected to the first oil passage 25, and the other end of the first groove part 35, which is connected to the second oil passage 26. The second groove part 36 passes the body 20 side of the power device 54. By forming the first groove part 35 and the second groove part 36 in the fixation plate 30, the cooling passage 40 has the two fluid routes between the first oil passage 25 and the second oil passage 26.

The fluid route of the cooling passage 40, which is formed by the second groove part 36, connects between the first oil passage 25 and the second oil passage 26 without passing the body 20 side of the other on-board devices (e.g., the on-board device 56 of FIG. 6) of the board 51 other than the power device 54. Thus, the ATF, which enters from the first oil passage 25 to the fluid route of the cooling passage 40, which is formed by the second groove part 36, passes only the body 20 side of the power device 54 and is drained into the second oil passage 26.

With the above construction, the ATF, which is heated by the heat released from the power device 54, will not flow near the other on-board devices to interfere with the heat release from the other on-board devices. Therefore, the total heat release from the control circuit arrangement 50 is promoted.

In the fourth embodiment, the second groove part 36 has a choked portion 37, which has a smaller cross section in comparison to the first groove part 36. Because of the choked portion 37, the majority of the ATF passes through the first groove part 35, so that the heat can be effectively released from the other on-board devices (e.g., the on-board device 56) other than the power device 54 and therefore also from the entire control circuit arrangement 50.

FIFTH EMBODIMENT

A control apparatus according to a fifth embodiment of the present invention will be described with reference to FIG. 7. In the fifth embodiment, components similar to those of the first embodiment will be indicated by the same numerals and will not be described further.

Figure 7:
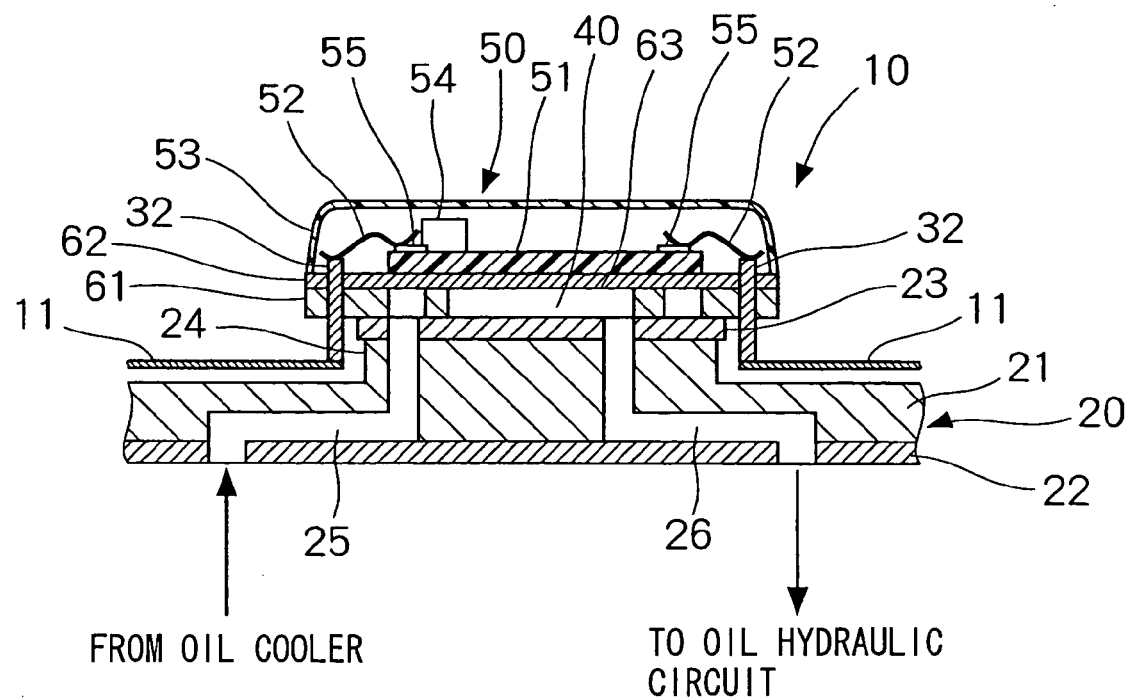
FIG. 7 is a cross sectional view showing a fixation plate of a control apparatus according to a fifth embodiment of the present invention.

In the fifth embodiment, as shown in FIG. 7, the control apparatus 10 includes a fluid passage forming plate (serving as a plate member) 61 and a fixation plate 62. The fluid passage forming plate 61 and the fixation plate 62 are stacked one after another on an opposite side of the second separation plate 23, which is opposite from the body housing 21. The fluid passage forming plate 61 has a passage portion 63, which corresponds to the cooling passage 40 and extends through the fluid passage forming plate 61 in a thickness direction of the fluid passage forming plate 61. Thus, the opposed sides of the fluid passage forming plate 61, which are opposed to each other in the thickness direction of the fluid passage forming plate 61, are covered by the second separation plate 23 and the fixation plate 62, respectively, to define the cooling passage 40, which corresponds to the configuration of the passage portion 63.

In the fifth embodiment, the control apparatus 10 has the fluid passage forming plate 61, which forms the cooling passage 40. Thus, by changing the passage forming portion 63 of the fluid passage forming plate 61, the complex cooling passage 40 can be easily formed. Therefore, the cooling passage 40 can be easily formed in a manner that corresponds to the positions of the on-board devices of the board 51.

The above embodiments are described as the individual embodiments. However, it should be noted the above embodiments can be combined in any appropriate manner.

Additional advantages and modifications will readily occur to those skilled in the art. The invention in its broader terms is therefore not limited to the specific details, representative apparatus, and illustrative examples shown and described.

What is claimed is:

1. A control apparatus comprising:
   a body that includes first and second fluid passages, which conduct fluid;
   a plate member that is installed to the body on one side of the body and includes a third fluid passage, which has a first end connected to the first fluid passage and a second end connected to the second fluid passage, wherein the third fluid passage conducts the fluid from the first fluid passage to the second fluid passage and said third fluid passage is formed to extend along a prescribed tortuous path therebetween; and
   a control circuit arrangement that includes:
      a board that is installed to a surface of the plate member, which is located on one side of the plate member that is opposite from the body; and
      a plurality of on-board devices that are arranged on one side of the board, which is opposite from the plate member.

2. The control apparatus according to claim 1, wherein:
   the plurality of on-board devices includes a heat generating device;
   the heat generating device is opposed to a first fluid passage side portion of the third fluid passage in a direction perpendicular to a plane of the plate member; and
   the first fluid passage side portion of the third fluid passage is closer to the first fluid passage than the second fluid passage.

3. The control apparatus according to claim 1, wherein:
   the plate member includes a tortuous groove on the other side of the plate member, which is adjacent to the body; and
   the groove of the plate member defines the third fluid passage in cooperation with the body.

4. The control apparatus according to claim 3, wherein the third fluid passage passes a predetermined point of the plate member, which is located between a body side end of the heat generating device and the body.

5. The control apparatus according to claim 4, wherein the plate member includes at least one fin that projects toward the body at the predetermined point of the plate member.

6. The control apparatus according to claim 4, wherein the third fluid passage has a fluid route, which passes the predetermined point of the plate member and which connects between the first fluid passage and the second fluid passage without passing between the rest of the plurality of on-board devices and the body.

7. The control apparatus according to claim 6, wherein the fluid route of the third fluid passage includes at least one choked portion, which has a reduced cross section.

8. The control apparatus according to claim 1, wherein said third fluid passage is generally spiral shaped.

9. The control apparatus according to claim 8, wherein said third fluid passage is comprised of a plurality of linear segments.

10. The control apparatus according to claim 1, wherein said third fluid passage is comprised of a plurality of linear segments.

11. The control apparatus according to claim 1, wherein the third fluid passage includes at least one choked portion that has a reduced cross section.

12. The control apparatus according to claim 1, wherein:
   the plurality of on-board devices includes a heat generating device; and
   the heat generating device at least partially overlaps with a predetermined portion of the third fluid passage in a direction perpendicular to a plane of the plate member.

13. The control apparatus according to claim 12, wherein:
   the plate member includes at least one fin that projects into the predetermined portion of the third fluid passage to form a finned section of the third fluid passage;
   a downstream section of the third fluid passage, which is between the finned section of the third fluid passage and the second fluid passage, has no fin; and
   a passage length of the downstream section of the third fluid passage is longer than a passage length of the finned section of the third fluid passage.

14. The control apparatus according to claim 12, wherein the third fluid passage includes:
   a first fluid passage segment that connects between the first fluid passage and the second fluid passage; and
   a second fluid passage segment that connects between the first fluid passage and the second fluid passage and is independent of the first fluid passage segment, wherein the second fluid passage segment includes the predetermined portion of the third fluid passage.

15. The control apparatus according to claim 14, wherein the second fluid passage segment of the third fluid passage is connected to the first fluid passage through a choked portion, which has a smaller cross section in comparison to a passage cross section of a connection between the first fluid passage segment of the third fluid passage and the first fluid passage.

16. A control apparatus comprising:
   a body that includes first and second fluid passages, which conduct fluid;
   a plate member that is installed to the body on one side of the body and includes a third fluid passage, which conducts the fluid from the first fluid passage to the second fluid passage and includes first and second passage segments, wherein the second passage segment bypasses the first passage segment; and a control circuit arrangement that includes:
- a board that is installed to a surface of the plate member, which is located on one side of the plate member that is opposite from the body; and
- a plurality of on-board devices that are arranged on one side of the board, which is opposite from the plate member, wherein the plurality of on-board devices includes a heat generating device, which at least partially overlaps with the second passage segment of the third fluid passage in a direction perpendicular to a plane of the plate member and does not overlap with the first passage segment of the third fluid passage in the direction perpendicular to the plane of the plate member.

17. The control apparatus according to claim 16, wherein a passage cross section of a connection between the second passage segment of the third fluid passage and the first fluid passage is smaller than a passage cross section of a connection between the first passage segment of the third fluid passage and the first fluid passage.

18. The control apparatus according to claim 16, wherein each of the first and second passage segments of the third fluid passage is formed as a groove on the other side of the plate member, which is adjacent to the body.

19. The control apparatus according to claim 16, wherein a passage length of the second passage segment of the third fluid passage is shorter than a passage length of the first passage segment of the third fluid passage.

* * * * *